United States Patent [19]

Shershen

[11] Patent Number: 5,262,728
[45] Date of Patent: Nov. 16, 1993

[54] COMBINATION FLASHLIGHT/LANTERN ELECTRIC CONTINUITY TESTER

[76] Inventor: Eugene D. Shershen, 1002 - 475 Elgin St., Ottawa, Ont., Canada, K2P 2E6

[21] Appl. No.: 935,529

[22] Filed: Aug. 25, 1992

[51] Int. Cl.⁵ ............................................. G01R 31/02
[52] U.S. Cl. .................................. 324/506; 324/507; 362/204
[58] Field of Search ...................... 324/506, 507, 556; 439/290, 500, 621, 622, 912; 362/191, 204

[56] References Cited

U.S. PATENT DOCUMENTS

| | | |
|---|---|---|
| 230,864 | 5/1923 | Schmidt . |
| 245,259 | 12/1924 | French . |
| 283,674 | 10/1928 | Hook . |
| 361,334 | 10/1936 | Bowmar . |
| 2,128,810 | 8/1938 | Fortine ............................ 175/183 |
| 2,209,119 | 7/1940 | Hoffman ......................... 175/183 |
| 2,588,559 | 3/1952 | Needham ........................ 324/507 |
| 2,666,894 | 1/1954 | Babernitsh ....................... 324/53 |
| 2,839,724 | 6/1958 | Chandler et al. ................. 324/53 |
| 3,007,110 | 10/1961 | Rosenstrach .................... 324/53 |
| 3,063,006 | 11/1962 | Steinberger ................ 324/506 X |
| 3,257,610 | 6/1966 | Fariss .............................. 324/53 |
| 3,711,768 | 1/1973 | Frazin ............................ 324/507 |
| 3,753,090 | 8/1973 | Tomek ............................ 324/53 |
| 3,775,677 | 11/1973 | Garrett et al. .................... 324/53 |
| 3,873,915 | 3/1975 | Hayes ............................. 324/506 |
| 4,250,446 | 2/1981 | Ponte ............................. 324/506 |

FOREIGN PATENT DOCUMENTS

| | | |
|---|---|---|
| 579716 | 7/1959 | Canada . |
| 583587 | 9/1959 | Canada . |
| 640778 | 5/1962 | Canada . |
| 698328 | 11/1964 | Canada . |
| 1235182 | 12/1988 | Canada . |
| 2248467 | 5/1975 | France ............................ 324/507 |
| 1394048 | 5/1975 | United Kingdom ............. 324/507 |

Primary Examiner—Gerard R. Strecker
Assistant Examiner—Diep Do
Attorney, Agent, or Firm—Weingram & Zall

[57] ABSTRACT

An improvement is provided in a combination flashlight (or lantern)/continuity tester having an insulated body and a (flashlight) bulb and batteries in series circuit. The improved tester, which is formed in the flashlight (or lantern) body, includes an entry site of a particular configuration into the interior of the body. The testing means includes a pair of electrically-conductive strips, each strip having a contact portion, adjacent to the body entry site and penetrating into the interior of the body. Each strip is also in electrical contact with the series circuit. The shape of the entry site is such as to guide terminals of the circuit element being tested into contact with respective ones of the strips. The electrical continuity of a fuse or light bulb is determined by the lighting of the bulb being tested and/or by the lighting of the lamp bulb of the flashlight.

24 Claims, 5 Drawing Sheets

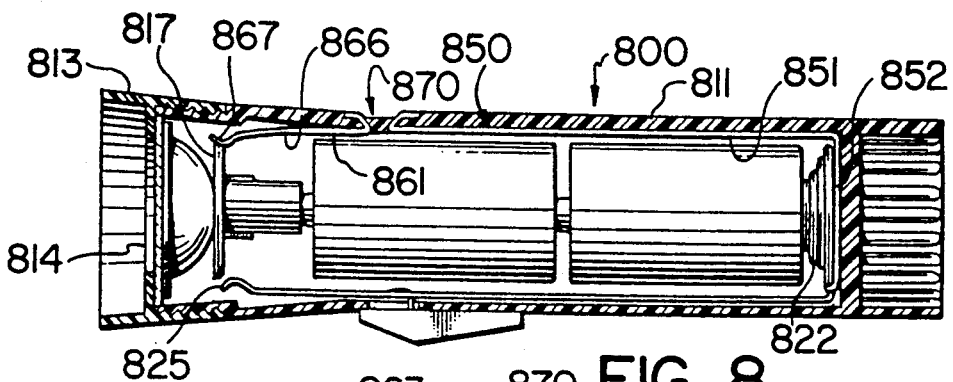
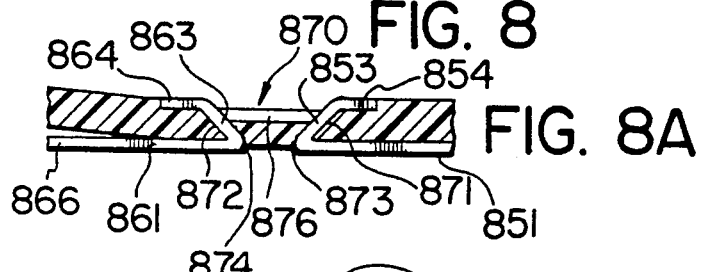
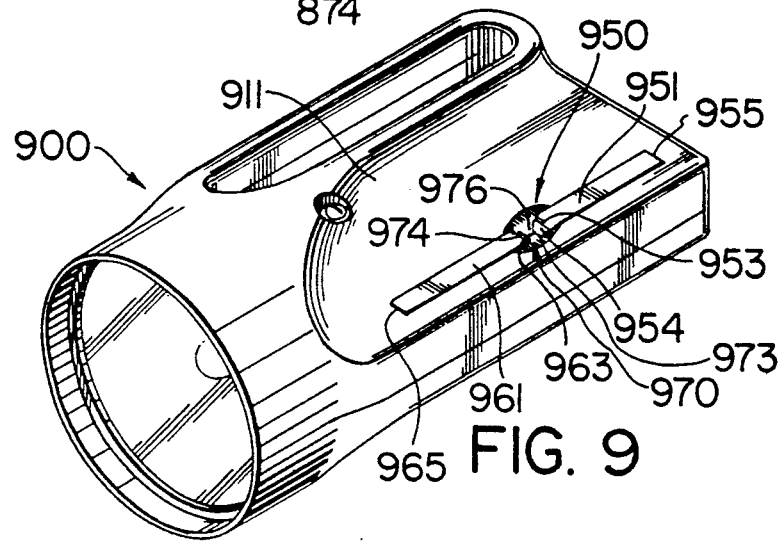
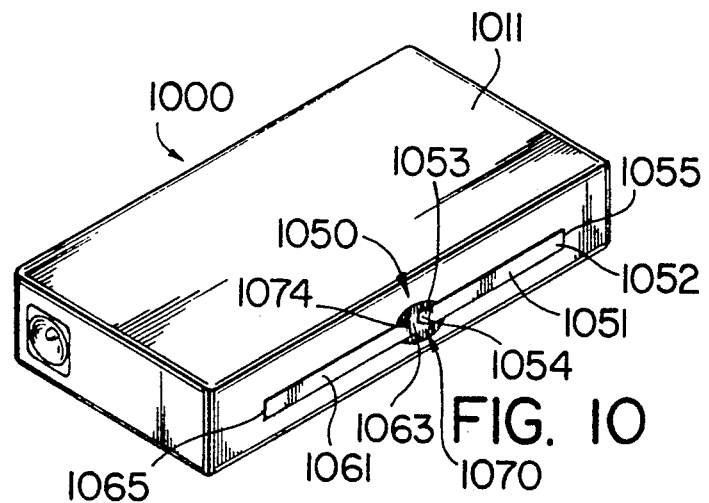

5,262,728

COMBINATION FLASHLIGHT/LANTERN ELECTRIC CONTINUITY TESTER

BACKGROUND OF THE INVENTION (i) Field of the Invention

The present invention relates to an electrical continuity tester which is combined with a flashlight (and/or lantern), and particularly to a continuity tester which is an integral part of a flashlight (and/or lantern).

(ii) Description of the Prior Art

It is frequently necessary to test the continuity of fuses and light bulbs. Normally, there is no- convenient means for effecting such continuity tests. As a consequence, the practice has previously been simply to replace fuses with new fuses thought to be in proper working order. The same situation also obtains with light bulbs.

The more popular commercial flashlights are, broadly speaking, of two types, one using an insulating tube for the batteries and a distinct electrical circuit, and the other using the flashlight enclosure proper as a part of the electrical circuit. Plastic encased flashlights, a variation of the first type above, are also available. The present invention was conceived as the combination of a continuity tester with a flashlight. In such unit, the need for light, as well as a continuity testing apparatus is met. Also, a flashlight provides a convenient and portable source of electrical current and a lamp which can be used as a continuity light.

There are many patents relating to combined flashlights and continuity testers, but many of these require a separate attachment to the end of the flashlight. Canadian Patent No. 230,864, patented May 8, 1923 by F. J. Schmidt, provided one such device in the form of a testing attachment for flashlights. It included a shell adapted for attachment to a flashlight. A flexible cord unit was removably-connected to the flashlight and was in electrical connection with the flashlight circuit. The unit was provided with testing terminals at the ends for engagement with the object to be tested.

Canadian Patent No. 245,259, patented Dec. 16, 1924 by A. James et al, provided an electric testing device, which included a casing, a lamp bulb, and an accompanying electric battery arranged in the casing. A separate testing lamp was arranged in the casing. Conductors were electrically connected to the testing lamp and were adapted to engage with the outside circuit to be tested.

Canadian Patent No. 283,674 patented Oct. 2, 1928 by L. T. Hook provided such a device in the form which was in combination with an electric flashlight having a detachable base, a sleeve secured to the base, and a collar slidably-mounted thereover having an interiorly threaded section. A spring was adapted to force the collar into contact with the negative pole of a battery in the flashlight. A member was provided having a base portion carrying an upstanding section. A spindle, terminating at one end in a head and at the other end in an exteriorly threaded section, extended through the member and was insulated therefrom. The upstanding section slidably engaged the sleeve and threadedly engaged the collar. The collar could be withdrawn from the contact with the battery and could be replaced by the head. An electric contact member, was contained with the first-named member and was insulated from the spindle. Such electric contact was adapted to provide a positive pole connection with the flashlight. An insulated casing was secured to the base portion. Means were secured to the contacts and extended through the casing for establishing an electric circuit through the flashlight and the instrumentalities.

Canadian Patent No. 361,334 patented Oct. 27, 1936 by G. Bowmar, provided such a device for operating and testing the electric circuit of an alarm system. The device included a casing, a lamp positioned within the casing adjacent to one end thereof and a battery within the casing. A switch was operable to complete the electric circuit through the battery and the casing to light the lamp. A plug was adapted for insertion in a socket in the electric circuit and extended from the other end of the casing. Electro-magnetic means were carried by the casing which, upon energization, was adapted to close the electric circuit through the battery and the casing to the lamp independent of the switch.

Canadian Patent No. 579,716 patented Jul. 21, 1959 by H. H. Hays, provided a flashlight including the usual casing, a light bulb, a battery-applied electric circuit for the bulb, and a switch in the circuit. A socket was provided on the casing, with its inner end in open communication with the interior of the casing, for the reception of a removable plug. A circuit breaker normally was positioned across the inner end of the socket and completely closed the passage between the socket and casing. The circuit breaker normally engaged and grounded to the inner end of the socket and was operable by a plug inserted in the socket to break such normal grounding of the circuit, which was then grounded through the plug to the side wall of the socket.

Canadian Patent No. 640,778 patented May 8, 1962 by D. B. Pasquale, provided a portable flashlight and testing device including a substantially cylindrical metal casing, a flashlight lamp socket, lamp, casing-insulated conductor member for the socket adjacent to one end of the casing, and a battery. A fixed, elongated conductor strip was connected to the conductor member at one end and extended to the other end of the casing. The casing terminated in an annular in-turned flange. An auxiliary socket included a metal threaded member, an annular flange on the latter in contact with the in-turned casing flange, and a center contact in the socket connected to the conductor strip. The conductor strip was insulated from the metal threaded member. The center contact extended through the openings formed by the flanges out of contact thereof. Means were provided for fixing the center contact in this position, such means included a portion of the strip.

Canadian Patent No. 1,235,182 patented Apr. 12, 1988 by J. C. Hayes provided a system for continuity testing having a housing, a battery with first and second electrodes in the housing, a first lamp with first and second terminals, first means for switching, and means connecting the first lamp first terminal through the first means for switching to the battery first electrode. A second lamp was also provided with first and second terminals, and was associated with a probe assembly, including a probe. Means connected the probe between the battery second electrode and the second lamp second terminal. A shunt circuit was provided between the first and second terminals of the second lamp. Second means for switching was connected in series with the shunt circuit. First and second leads were provided with respective contacts, the second lead being connected with the first electrode, and the first lead being connected with the first terminal of the second lamp.

U.S. Pat. No. 2,209,119 patented Jul. 23, 1940 by J. Ellsworth provided a testing attachment for a flashlight comprising an elongated tubular part attached to the case of nonconducting material of the flashlight, a part connected to the tubular member and passing through the case and contacting a part on the lamp socket of the flashlight. The tubular member had an elongated slot therein formed with angular end parts. A rod was provided for engaging a part of the device to be tested when the rod was projected, the rod being slidably arranged in the tubular member. A pin was on the rod sliding in the slot and engaged the annular parts for holding the rod in either projected position or in a position within the tubular member. A housing was connected with the rear metal cap of the flashlight. A spring actuated reel was carried in the housing and a metal tape was carried by the reel and passed through a slot in the housing. The tape was adapted to be contacted with another part of the device to be tested.

U.S. Pat. No. 3,753,090 patented Aug. 14, 1973 by H. P. Tomek provided a flashlight adapted to either a normal portable lighting function or to use as a continuity tester. Two electrical conductors, used externally, served as continuity test probes. One of these conductors was electrically-connected through the flashlight bulb to one side of the battery supply. The second conductor was electrically-connected to a second side of the battery supply. Continuity was checked by touching the probes to the circuit to be tested. The bulb glowed when the circuit was continuous.

U.S. Pat. No. 3,775,677 patented Nov. 27, 1973 by D. C. Garrett et al, provided a continuity tester including circuit interruption means coupled in series with the electrical circuit of a flashlight. A pair of continuity testing leads was connected to the interruption means by a plug to which the leads were coupled. A switch-including jack was positioned on the flashlight and was coupled to the interruption means. When the continuity leads were disconnected by removing the plug, the jack switch electrically bypassed the interruption means and the flashlight could be operated in a normal fashion. When the leads were connected by inserting the plug into the jack, the jack switch changed position and the flashlight could be lighted only when electrical continuity existed between the test leads.

Other patents provided such continuity tester devices that did not require such attachments to the end of the flashlight.

Canadian Patent No. 583,587 patented Sep. 22, 1959 by J. Chandler et al, provided a flashlight including an electrically conductive casing constituting a ground for a contained battery unit. An electrically-conductive bulb holder was mounted in one end of the casing and was insulated therefrom. An electrical contact was affixed to the bulb holder. Switch means including a longitudinally-slidable, permanently-grounded contact member was flexibly engageable with one face of the affixed contact and was slidable into and out of such engagement. A normally-protruding conductive plunger was mounted in, and was insulated from, the casing opposite the engaging end of the grounded contact member. This was adapted, when depressed, to engage the end of the grounded contact member and to flex it from contact with the affixed contact and thereby to open the switch contacts. An auxiliary contact was carried by the plunger in position to engage the other face of the affixed contact when the plunger was depressed to a position to flex the grounded contact member and open the switch contacts.

Canadian Patent No. 698,328 patented Nov. 24, 1964 by D. Ciardiello, provided such a device in the form of a flashlight having a cylindrical insulated body, a pair of metal rings at opposite ends of the body, a lamp bulb and batteries in series circuit with the rings. A circuit element testing means included a stud mounted at one end of the body in direct electrical circuit with one of the rings, and an elongated electrical conductor carried by the body and spaced longitudinally from the stud. The conductor was in direct electrical circuit with the other of the rings, so that the lamp bulb was lit when one terminal of the element was in contact with the stud and when another terminal of the element was in contact with the conductor to indicate electrical continuity existed between the terminals of the element. The stud had a head and an undercut portion for engaging a terminal lead of the element around the undercut portion. The conductor was a flat strip disposed on the outside of the body and had further studs mounted thereon and spaced apart along the strip. The conductor was a wire member having a bent end contacting the other ring. The wire member had a notch formed therein for receiving a terminal lead of the element, the member being juxtaposed to the outside of the body. The device also included a clip having spring fingers engaged on the wire member and movable therealong so that elements of different sizes can be tested between the stud and the clip. The other member was formed with a doubly bent portion engaged in an aperture in the body near the stud.

U.S. Pat. No. 1,653,669 patented Dec. 27, 1927 by B. M. Rydzy provided a combined combination flashlight and circuit tester including the combination with a flashlight having a control switch, a metallic casing, and a metallic reflector insulated from the casing and adapted to engage a terminal of the lamp. A contact member was provided having a stem projecting through the casing with a washer on the stem tapering inwardly toward the casing. Insulation was provided between the stem and washer and between the contact and washer. Resilient means was provided at the inner end of the stem engageable with the reflector to form a circuit with the lamp for testing purposes. An insulating shield was fitted over the contact member with its inner portion contacting over the tapering portion of the washer to prevent accidental displacement of the shield.

U.S. Pat. No. 2,128,810 patented Aug. 30, 1938 by C. E. Fortine provided a combined flashlight and tester including the combination with a portable flashlight having a casing, a light circuit, and a switch in the circuit having an operating button slidably mounted on the side of the casing intermediate the ends of the casing. An insulated conductor slidably mounted in the casing and was connected in closed circuit position in the light circuit both in the "on" and in the "off" positions of the switch. An insulated test terminal was connected to the conductor and projected through the button. The test terminal had an uninsulated free end forming a contact exposed exteriorly of the button. The arrangement was such that the lamp circuit was closed when the terminals of an operative lamp or fuse to be tested were brought respectively into contact with the casing and with the contact.

U.S. Pat. No. 2,666,894 patented Jan. 19, 1954 by J. Babernitsh provided a combined fuse tester and flashlight comprising a tubular non-conducting casing, a conductive first collar attached to the outside of the casing at one end, and a second conductive collar attached to the outside of the casing at the other end. An electrically-conductive apertured cap was provided in threaded engagement with the first collar. A flanged conductive socket was seated on the end of the first collar within the cap. A bulb was disposed in the socket with its vitreous end in the aperture in the cap. A straight conductive strip was on the outside of the casing and was electrically connected to, and extended from, the first collar toward the second collar and then through the non-conducting casing and along the inside thereof. An apertured conductive cap was in threaded engagement with the second collar. An annular internal rib in the cap defined a seat, and a spring-pressed conductive contact plate was normally positioned on the seat. A button was attached to the contact plate and extended slidably through the apertured cap. A battery was disposed in the casing with one electrode in contact with a contact of the bulb. An apertured conductive closure plate was positioned inside, and at the end of, the non-conductive casing in contact with the end of the conductive strip and in opposition to the contact plate. A conductive spring was provided with one end in engagement with the other electrode of the battery and the other end extending through the aperture in the closure plate and in electrical contact with the contact plate. The spring normally urged the contact plate into spaced relation to the closure plate, and the button was adapted to move the contact plate into engagement with the closure plate.

U.S. Pat. No. 2,681,433 patented Jun. 15, 1954 by T. S. Palmer, provided a flashlight-type tube tester which included the combination with a portable flashlight of the type having a casing, a flared head portion including a bulb and bulb socket, a light circuit, and a switch in the circuit having an operating button slidably mounted on the side of the casing intermediate the ends of the casing. The improvement included a fuse and lamp testing device including an insulated contact having an operative and an inoperative position slidably mounted in the flared head portion. The flared head had a transverse slot intermediate its ends through which one end of the contact extended. The contact had an enlarged inner body portion and a reduced outer portion with the inner portion being provided with a rectangular opening of a greater length and width than the diameter of the light bulb socket and through which the socket extended. A depending contact portion was on the outer end of the contact. The contact, in its operative position, only was in contact with the bulb socket in a closed circuit, with the light circuit both in the "on" and in the "off" positions of the switch. The lamp circuit was closed when the terminals of an operative lamp or fuse to be tested were brought respectively into contact with the casing and the sliding contact.

U.S. Pat. No. 2,839,724 patented Jun. 17, 1958 by J. Chandler et al, provided a flashlight and electrical tester in the form of an electrical flashlight comprising an electrically conductive casing constituting a ground for a contained battery unit, an electrically conductive bulb holder mounted in one end of the casing and insulated therefrom, an electrical contact affixed to the bulb holder, and switch means including a longitudinally slidable permanently grounded contact member flexibly engageable with one face of the affixed contact and slidable into and out of such engagement. A normally protruding conductive plunger was mounted in, and was insulated from, the casing opposite the engaging end of the grounded contact member and was adapted, when depressed, to engage the end of the grounded contact member and to flex it from contact with the affixed contact and thereby open the switch contacts. An auxiliary contact was carried by the plunger in position to engage the other face of the affixed contact when the plunger was depressed to a position to flex the grounded contact member and to open the switch contacts.

U.S. Pat. No. 3,007,110 patented Oct. 31, 1961 by H. Rosenstrach, provided a flashlight electrical utility tester including the combination with a flashlight having a control switch, a casing, a flashlight light bulb and flashlight batteries within the casing. The combination included contact terminals which were insulated from and were independent of the switch, and were in spaced relation to, and were insulated from each other. They had cup-shaped main portions as well as rim portions provided with open slots and were mounted with their main portions on the outer side of the flashlight casing. They were adapted for being connected to terminals of an electrical circuit. An electrical current may pass from a first one of said contact terminals, over a conductive object to be tested and conductively connected to the contact terminals to a second one of the contact terminals, through the casing, the batteries, and to the light bulb to the first contact terminal.

U.S. Pat. No. 3,257,610 patented Jun. 21, 1966 by R. O. Fariss, provided a portable flashlight having circuit testing means and a rotating telescoping head portion with cut-out for exposing a test contact in the form of a flashlight. The device included a casing incorporating battery means and a head structure telescoped over and coupled to the upper end of the casing and incorporating a light bulb. An exposed first conducting contact surface was provided on the casing. A second contact surface was provided on the upper portion of the casing beneath the portion of the head structure telescoped thereover. The head structure included a cut-out in its telescoping portion such that rotation thereof exposed the second contact through the cut-out. Connecting means were provided for connecting the first and second contacts with the battery means and light bulbs so that short-circuiting of the first and second contacts lights the light bulb. In this way, fuses and the like may be tested by bridging the same across the first and second contacts.

All of the above described patented devices performed their desired objects fairly well. In spite of the attainment of such objects, the devices fell short of providing an optimum device.

SUMMARY OF THE INVENTION (i) Aims of the Invention

In those devices, which require the addition of elements to the end thereof, the flashlight became more expensive to make and was more complicated to use as a tester. As thus noted, there were problems with the devices of the prior art. While continuity testers are old in the art and work well for their intended purposes, the more common types are not intended to be carried by the user continually.

In the devices which included sliding contacts, there was the problem of making adequate electrical contact with the sliding member, coupled with the fact that sliding contacts can become inoperative (by corrosion)

if they are not used frequently or by wear if used frequently.

On the other hand, in the devices which included one fixed contact and a second electrical contact made by the metallic body of the flashlight or by a metallic strip secured to the flashlight, there was the likelihood of faulty connection between the contact surfaces of the electrical device being tested and the electrical contacts of the flashlight.

Furthermore, in devices where there were two spaced-apart electrical contacts, the device was generally only adaptable for the testing of a small finite number of types of electrical devices and was not universally adaptable.

Accordingly, the main object of the present invention is to provide an improvement in the above-described flashlight/continuity testers and to provide a simple device by means of which circuit testing may readily be carried out, employing the light of the flashlight device as the indicating means.

Another object of this invention is to provide such a continuity tester in which the electrical contacts are such that, for certain bulbs and fuses to be tested, they positively guide the contact points of those devices being tested into direct electrical contact with the electrical contacts of the flashlight.

Yet another object of this invention is to provide such a continuity tester which is universally adaptable for testing a wide variety of electrical devices.

(ii) Statements of Invention

The present invention provides an improvement in a flashlight (or lantern) having an insulated body, and having a bulb and batteries in series circuit. The improvement is in the form of a testing means for a circuit element. The testing means, which is formed in the flashlight (or lantern) body, includes an entry site including a pair of converging, sloping, facing walls separated by a pair of spaced-apart slits in a floor of the entry site, each slit penetrating into the interior of the body. The testing means includes an electrically-conductive strip extending in a first direction and having a contact portion, the contact portion following the sloping contour of one wall of the body entry site and penetrating into the interior of the body through one slit in the floor, that portion terminating in a secured end, the other end of such strip being in electrical contact with one end of the series circuit. It also includes another electrically-conductive strip extending in a second direction terminating in a secured end, the other end of the strip having a contact portion, the contact portion following the sloping contour of the other wall of the body entry site and penetrating into the interior of the body, through the other slit in the floor, that contact portion of the strip having a conducting portion in electrical contact with the bulb end of the series circuit. The entry site is so proportioned that the two contact portions of the strips which follow the shape and contour of the walls of the entry site provide a guideway to guide terminals of the circuit element being tested into contact with respective ones of the strips.

(iii) Other Features of the Invention

In use, if a fuse is being tested, electrical continuity is determined by the lighting up of the light bulb of the flashlight. On the other hand, if a bulb is being tested, electrical continuity is determined by the lighting of the bulb being tested and/or by the lighting of the lamp bulb of the flashlight.

This invention thus provides means for converting the common flashlight or lantern into a continuity tester. Defects in fuses and bulbs may be checked whenever the battery voltage is sufficient to provide current flow in a continuous circuit.

In one feature of the invention, the strips are external, while in another feature of the invention, the strips are internal. In either case, by a first feature of the invention, the strips may extend along the longitudinal axis, preferably along the bottom thereof, of the flashlight, (or lantern) and, may be either of equal or of unequal length. One such strip is electrically connected to the rear end of the series circuit, and the other such strip is electrically connected to the bulb end of the series circuit.

By a second feature of the invention, the strip may be in the form of transverse disconnected strips disposed across the bottom end of the flashlight (or lantern). The strips may be of equal length or of unequal length. One end of one strip, which penetrates the flashlight (or lantern) is electrically connected to the rear end of the series circuit, while one end of the other strip, which also penetrates the flashlight (or lantern), is electrically connected to the bulb end of the series circuit. The strips also include the contact portions within the entry site as previously described.

By a third feature of the invention, the strips partially encircles a region of the flashlight (or lantern). One end of one strip, which penetrates the flashlight (or lantern), is electrically connected to the rear end of the series circuit, while one end of the other strip, which also penetrates the flashlight (or lantern), is electrically connected to the bulb end of the series circuit. These ends are situated within the entry site as previously described.

Another embodiment of the invention, which can be used with any of these features of the invention, is the provision of a fuse-gripping well at the cylindrical end of the flashlight.

BRIEF DESCRIPTION OF THE DRAWINGS

In the accompanying drawings,

FIG. 8 is a central longitudinal cross-section of another embodiment of the invention;

FIG. 8A is an enlargement of the testing portion of the present invention shown in FIG. 8;

FIG. 9 is a perspective view of another alternative embodiment of the present invention;

FIG. 10 is a perspective view of another alternative embodiment of the presnt invention.

Figure 1:
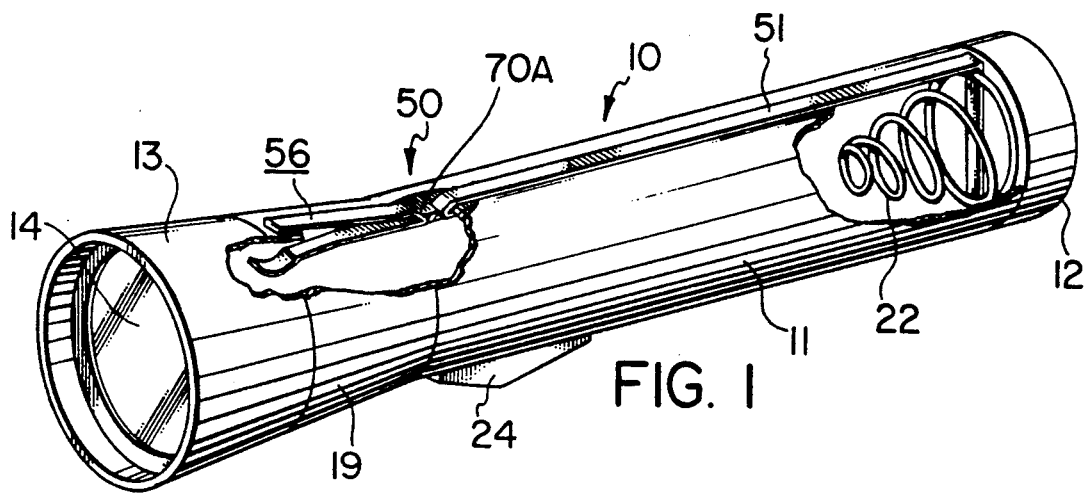
FIG. 1 is a perspective view, partly broken away of one embodiment of the present invention.
Figure 2:
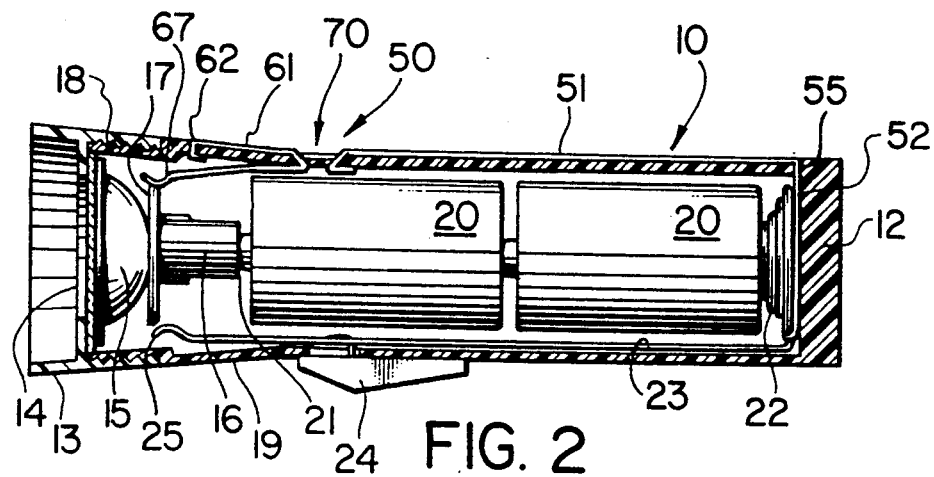
FIG. 2 is a central longitudinal cross-section of the embodiment of the invention shown in FIG. 1.
Figure 2A:
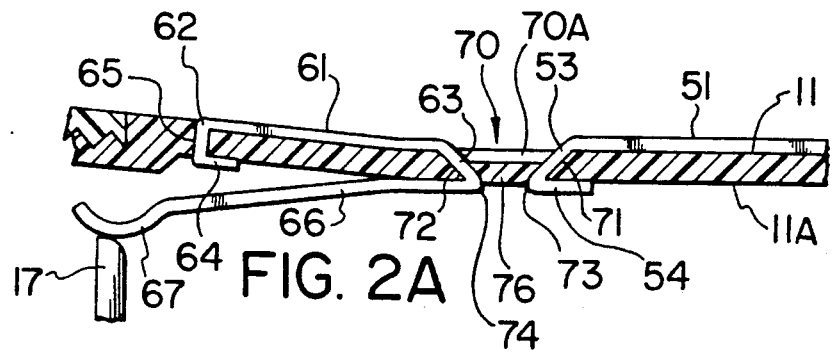
FIG. 2A is an enlargement of the testing portion of the present invention shown in FIGS. 1 and 2.

DESCRIPTION OF PREFERRED EMBODIMENTS (i) Description of FIGS. 1, 2 and 2A

FIGS. 1 and 2 show the flashlight 10, which is improved according to the present invention. As is conventional, the flashlight 10 includes a main cylindrical body 11 provided with an end cap 12 (which may be a screw-on separate cap, or a cap integral with body 11) and an outwardly-flared front end 13 having an inset transparent material, e.g. glass 14, protecting a bulb 15, which is mounted in a socket 16, which also has an electrically-conducting flange 17 therearound. Access to the bulb 15 is by way of threaded engagement 18 between the flared front end 13 and the diverging forward end 19. Within the main cylindrical body 11 is a pair of batteries 20 urged into contact with the electrical contact 21 of the bulb by means of coil spring 22. An electrical "on-off" switch means is provided by internal electrical conductor 23 extending from the behind spring 22 to a switch 24. As shown in FIG. 2, it is in the "off" position. Conductor 23 is cantilevered at flexible end 25 towards electrically-conducting flange 17. Movement of the switch 24 to the left (as seen in FIG. 2) will cause the flexible end 25 to contact electrically-conducting flange 17, thereby completing a series circuit and causing the bulb 15 to light.

To provide the circuit tester 50 of the present invention the flashlight 10 is provided with an entry site 70 which includes a depressed area 70A (See FIG. 2A). Entry site 70 includes a pair of opposed, converging walls 71,72. The walls are separated by a floor 76 pierced by a pair of spaced-apart slits 73,74. The significance of the geometric orientation of walls 71,72 and slits 73,74 will now be described:

The longitudinal length of the entry site 70 which includes depressed area 70A and floor 76 and the angle of convergence of the opposed converging walls 71,72 are selected to be such as to enable the contact portions 53,63 of the strips 51,61 which enter the flashlight 10 through the slits 73,74 in the floor 76 to act as a guideway to guide contact ends of bulbs or fuses to be tested (not shown) into suitable electrical contact.

The circuit tester 50 of the present invention shown in FIGS. 1, 2 and 2A includes a longitudinally-extending strip 51 [either projecting above the surface of the body 11, or disposed within a slot (not shown) within the surface of the body 11] having one end 52 within the interior of the body 11 at the rear end of the flashlight 10 through slit 55, so as to be in electrical contact behind, and with, spring 22. The other end of strip 51 includes a body-penetrating contact portion 53 which follows the contour and slope of wall 71, and enters the body 11 through slit 73 and finally terminates securement end 54 in contact with the inner surface 11A of body 11. Thus the body-penetrating contact portion 53 enters the body 11 through one slit 73 which is generally of the same width and thickness as the strip 51.

The circuit tester 50 also includes another, longitudinally-extending strip 61, having a body-penetrating entry portion 62 which follows the contour and slope of diverging forward end 19 of the body 11. This portion 62 enters the interior of the flashlight 10 through a slit 65 and terminates in a securement end 64 in contact with the inner surface 11A of body 11. Strip 61 includes a body-penetrating contact portion 63 which enters body 11 through slit 74 and finally terminates in a forwardly-extending arm 66 which includes a terminal contact end 67 in electrical contact with flange 17.

While the circuit tester 50 is shown as external strips 51,61 which are inset into the body 11, the external strips 51,61 can also be raised above the body 11. Furthermore, the strips 51,61 may be created of electrically-conductive paint painted on an electrically non-conductive body; or may be created of electrically-conductive plastic, provided on electrically non-conductive plastic; or may be created as a conductive metal strip formed by an electrically-non-conductive coating on a metal body, the non-coated portion providing the metal strip.

The longitudinal length of the entry site and the angle of convergence of the opposed converging walls are selected to be such as to enable the contact portions of the strips which enter the flashlight through the slits in the floor to act as a guideway to guide contact ends of bulbs or fuses to be tested into suitable electrical contact. If the bulb being tested is not burned out or otherwise defective, such bulb or the flashlight bulb, will light. If the fuse being tested is not burned out or otherwise defective, the flashlight bulb will light.

Figure 3:
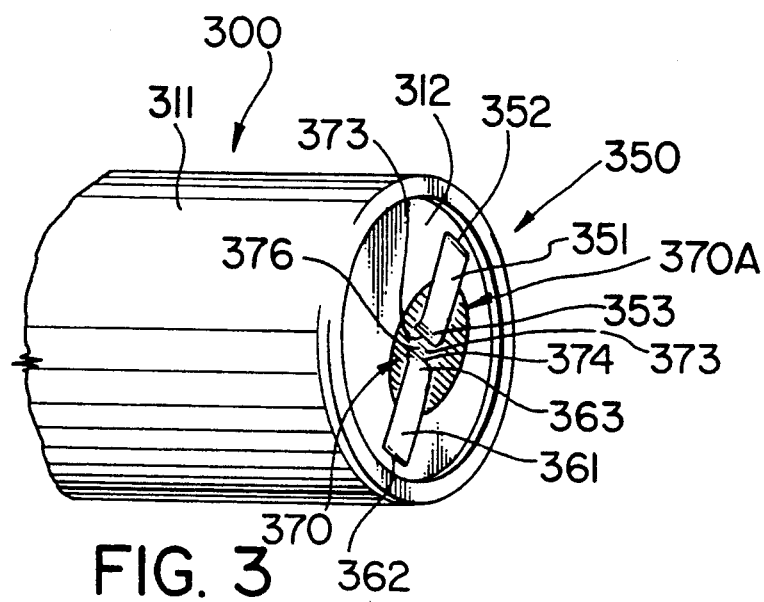
FIG. 3 is a partial rear perspective view of an alternative embodiment of the present invention.

(ii) Description of FIG. 3

FIG. 3 shows an alternative continuity testing device according to the present invention, namely 350, on flashlight 300.

The circuit tester 350 of the present invention shown in FIG. 3 includes a strip 351 having one end (not shown) entering the body 311 through slit 352. Such entry end is in electrical contact behind and with a spring (not shown) but which is equivalent to spring 22 in FIG. 1. The other end of strip 351 includes a body-penetrating contact portion 353 which follows the contour and slope of a wall (equivalent to wall 71 in FIG. 2A), which enters through a slit 373 at entry site 370 which includes depressed area 370A (slit 373 being equivalent to slit 73 in FIG. 2A) and which terminates in a securement end (not shown) but which is equivalent to end 64 in FIG. 2A. Thus the body-penetrating contact portion 353 enters the body 311 through one slit 373 at entry site 370, the slit being generally of the same width and thickness as the strip 351.

The circuit tester 350 also includes another outer strip 361, having an end (not shown) which enters body 311 through slit 362. Such entry end is secured to the interior of the body 311 in contact with a spring (not shown) which is equivalent to spring 22 in FIG. 1. The other end of strip 361 includes a body-penetration contact portion 363 which follows the contour and slope of a wall (not shown) but which is equivalent to wall 72 in FIG. 2A, and which enters through a slit 374 at entry site 370, slit 374 being equivalent to slit 74 in FIG. 2A. The body-penetrating contact portion 363 enters the body 311 through such slit 374 at entry site 370, the slit being generally of the same width and thickness as the strip 351. Such other end extends to an arm (not shown) but which is equivalent to arm 61 in FIG. 2A which contacts a flange, (not shown) but which is equivalent to flange 17 in FIG. 2.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, will light. If the fuse being tested is not burned out or otherwise defective, the flashlight bulb will light.

Figure 4:
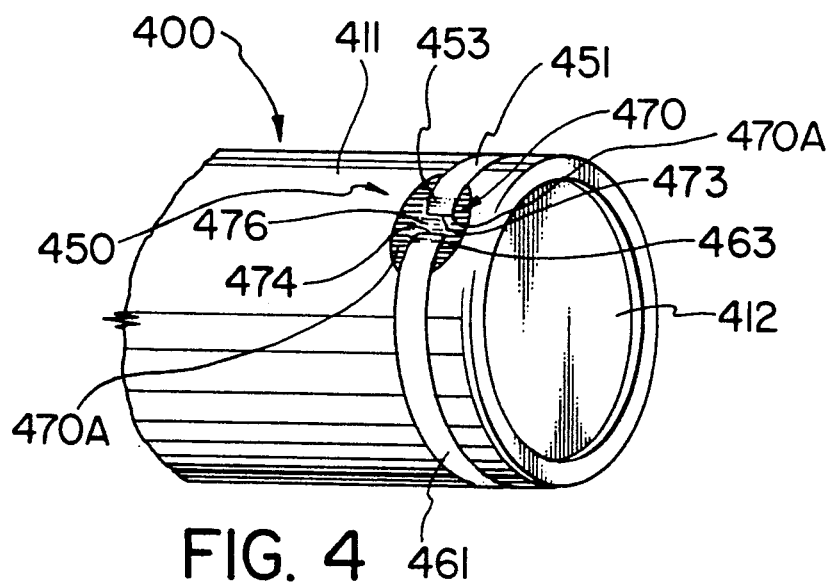
FIG. 4 is a partial rear perspective view of another alternative embodiment of the present invention.
Figure 5:
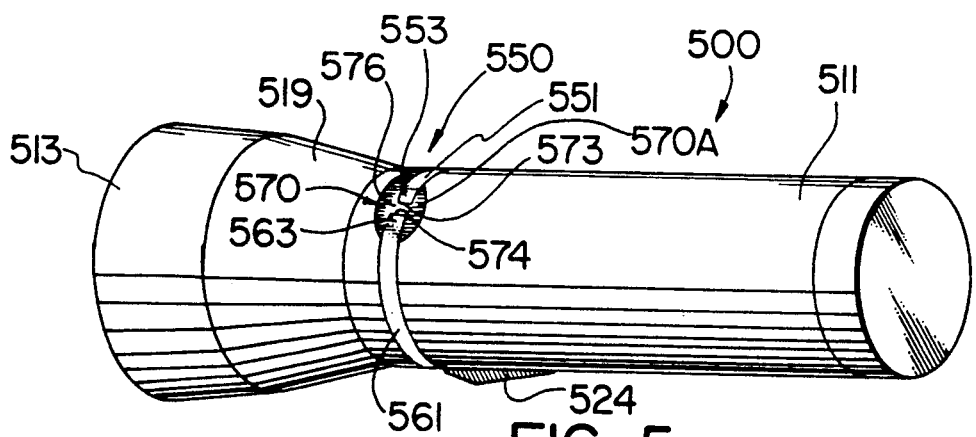
FIG. 5 is a perspective partial view of yet another alternative embodiment of the present invention.

(iii) Description of FIGS. 4 and 5

FIGS. 4 and 5 show two other alternative electrical continuity testing devices according to the present invention, namely 450 and 550.

As seen in FIG. 4, the circuit tester 450 of the present invention includes two encircling bands 451 and 461 near the end 412 of the flashlight 400. Band 451 has one contact end 453 entering the body 411 through slit 473, which is equivalent to slit 73 in FIG. 2A at entry site 470. Another end (not shown) enters the flashlight 400 and is in electrical contact behind, and with, a spring (not shown) but which is equivalent to spring 22 in FIG. 1. The entry site 470 is of generally depressed configuration 470A terminating in floor 476. The contact end 453 is thus a body-penetrating contact portion which follows the contour and slope of a wall (not shown) but which is equivalent to wall 71 in FIG. 2A and which enters through slit 473 (equivalent to slit 73 in FIG. 2A) in floor 476. Thus the body-penetrating contact portion 453 enters the body 411 through one slit 473 at entry site 470, the slit being generally of the same width and thickness as the band 451.

One end of band 461 (not shown) enters the flashlight 400 and is in electrical contact with a flange (not shown) but which is equivalent to flange 17 in FIG. 2. The other end of band 461 enters the body 411 through slit 474 at entry site 470. Contact end 463 is thus a body-penetrating contact portion which follows the contour and slope of a wall (not shown) but which is equivalent to wall 72 of FIG. 2A and which enters through slit 474 at entry site 470, which slit is equivalent to slit 74 of FIG. 2A in floor 476. Thus the body-penetrating contact portion 463 enters the body 411 through one slit 474 at entry site 470, the slit being generally of the same width and thickness as the strip 451*b*.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, will light. If the fuse being tested is not burned out or otherwise defective, the flashlight bulb will light.

(iv) Description of FIG. 5

As seen in FIG. 5, the circuit tester 550 of the present invention includes two encircling bands 551 and 561 near the end 513 of the flashlight 500. Band 551 has one contact end 553 entering the body 511 through slit 573, which is equivalent to slit 73 in FIG. 2A at entry site 570. Entry site 570 is of generally depressed configuration 570A terminating in floor 576. Another end (not shown) enters the flashlight 500 and is in electrical contact behind, and with, a spring (not shown) but which is equivalent to spring 22 in FIG. 1. The contact end 553 is thus a body-penetrating contact portion which follows the contour and slope of a wall (not shown) but which is equivalent to wall 71 in FIG. 2A and which enters through slit 573 at entry site 570 (equivalent to slit 73 in FIG. 2A) in floor 576. Thus the body-penetrating contact portion 553 enters the body 511 through one slit 573 at entry site 570, the slit being generally of the same width and thickness as the strip 551.

One end of band 561 (not shown) enters the flashlight 500 and is in electrical contact with a flange (not shown) but which is equivalent to flange 17 in FIG. 2. The other end of band 561 enters the body 511 through slit 574 at entry site 570. Contact end 563 is thus a body-penetrating contact portion which follows the contour and slope of a wall (not shown) but which is equivalent to wall 72 of FIG. 2A and which enters through slit 574 at entry site 570, the slit being equivalent to slit 74 of FIG. 2A in floor 576. Thus the body-penetrating contact portion 553 enters the body 511 through one slit 574 at entry site 570, the slit being generally of the same width and thickness as the band 561.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, will light. If the fuse being tested is not burned out or otherwise defective, the flashlight bulb will light.

Figure 6:
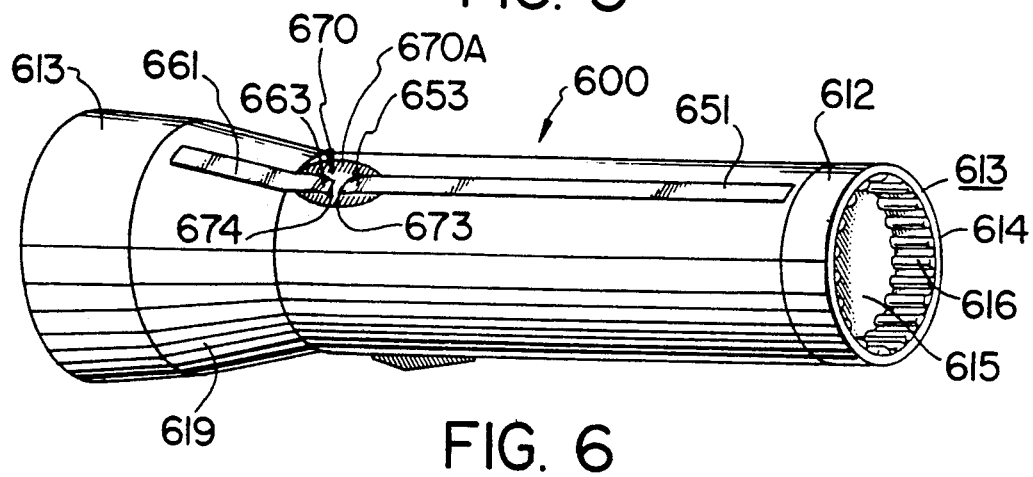
FIG. 6 is a perspective view of still another alternative embodiment of the present invention.

(v) Description of FIG. 6

FIG. 6 shows a modified rear end 612 of the flashlight 600 which may be used with any of the above described embodiments of the invention, although it is shown used with the embodiment of FIGS. 1, 2 and 2A. Thus, the same reference numbers are used in FIG. 6 as in FIG. 1 with the exception that they are in the "600" series, and so they will not be described further.

As seen in FIG. 6, the modified end is a modified integral end cap 612 which is in the form of a well 613 having upstanding cylindrical outer walls 614 and a base 615. The interior of wall 614 is slightly converging (towards base 615) and is provided with a plurality of upstanding, spaced-apart ribs 616. Ribs 616 may be used to grip a fuse to enable safe and easy removal from a fuse box, or for the replacement of a fuse therein. The use of end 613 thus provides improved grip and safety in the removal and replacement of fuses.

Figure 7:
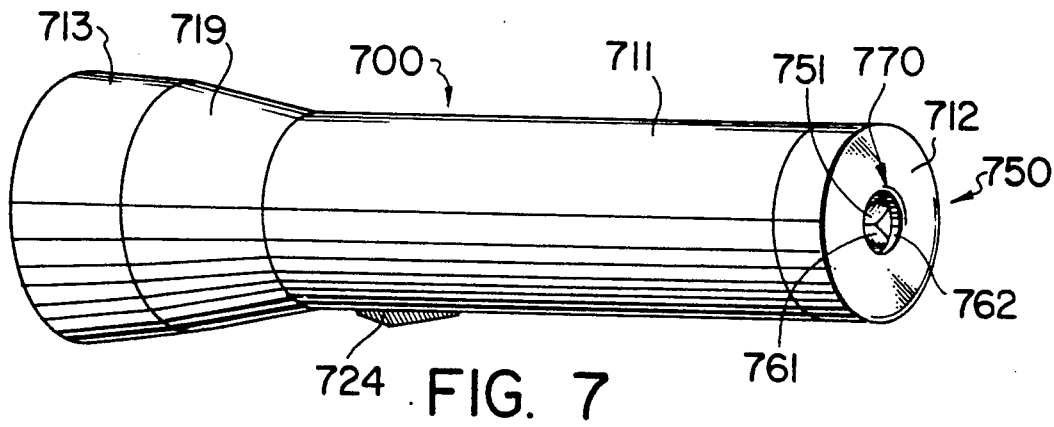
FIG. 7 is a perspective view of yet another alternative embodiment of the present invention.

(vi) Description of FIG. 7

FIG. 7 shows yet another embodiment of the continuity tester 750. This tester is in the form of a pair of spring-biased sloping converging strips 751,761 disposed within the end 712 of the flashlight 700 and within frusto-conical open recess 762 at entry site 770.

The internal ends of strips 751 and 761 are connected respectively, to the rear end of the series circuit of the flashlight 700, and to the flashlight bulb end of the series circuit of the flashlight 700 via the switch 724 of the flashlight, which is itself connected to the bulb and to the rear in the manner previously described for FIG. 1.

The diameter of the entry site and the angle of convergence of the opposed converging spring-biased strips are selected to be such as to enable the strips to act as a guideway to guide contact ends of bulbs, to be tested, into suitable electrical contact. To test the bulb, the flashlight must be turned "on". If the bulb being tested is not burned out or otherwise defective, such bulb will light.

(vii) Description of FIGS. 8 and 8A

The circuit tester 850 of the present invention shown in FIG. 8 shows a flashlight 800 which includes an internal strip 851 having one end 852 in electrical contact behind, and with, a spring 822. The other end of strip 851 includes a body-emergent contact portion 853 which exits through a slit 873, at entry site 870, which also includes a depressed are 870A. Strip 851 thus follows the contour and slope of wall 871, and terminates in a securement end 854. Thus the body-emergent contact portion 853 exits the body 811 through one slit 873 at entry site 870, the slit being generally of the same width and thickness as the strip 851.

The circuit tester 850 also includes another inner strip 861, having contact portion 863 which exits through a slit 872 at entry site 870 and follows the contour and slope of wall 872 to provide contact portion 863. It terminates at an end 864 which is secured to the exterior of the body 811. Within body 811, strip 861 extends to an extending arm 866 which includes a terminal contact 867 which contacts flange 871. Thus, the body-emergent contact portion 863 exits the body 811 through one slit 874 at entry site 870, the slit being generally of the same width and thickness as strip 861.

Contacts 873 and 854 are at entry site 870 which has a generally depressed region 870A and has a floor 876 which is penetrated by slits 874 and 872.

(viii) Description of FIG. 9

FIG. 9 shows a continuity tester 950 in association with a different form of a flashlight or lantern 900. As seen in FIG. 9, the continuity tester 950 of the present invention includes a longitudinally-extending outer strip 951 having one end (not shown) but which is equivalent to end 52 of FIG. 2A within the interior of the body 911 at the rear end of the flashlight (or lantern) 910 through slit 955 to be in electrical contact behind, and with, a spring (not shown) but which is equivalent to spring 22 in FIG. 1. The other end of strip 951 includes a body-penetrating contact portion 954 which follows the contour and slope of a wall (not shown) but which is equivalent to 71 in FIG. 2A. It then penetrates body 911 through slit 973 at entry site 970 which includes depressed area 970A, and finally terminates in a securement end (not shown) but which is equivalent to securement end 54 in FIG. 2A in contact with the inner surface of body 911. Thus, the body-penetrating contact portion 953 enters the body 911 through one slit 973 at entry site 970, the slit being generally of the same width and thickness as the strip 951.

The circuit tester 950 also includes another longitudinally-extending strip 961, having a body-penetrating entry (not seen, but which is equivalent to 62 in FIG. 2A). This end enters the interior of the flashlight 910 through a slit 965 and terminates in a securement end (not shown) but which is equivalent to securement end 64 in FIG. 2A in contact with the inner surface of the body 911. Strip 956 includes a body-penetrating contact portion 963 which enters through the slit 974 at entry site 970 and finally terminates in a forwardly-extending arm (not shown) but which is equivalent to 66 in FIG. 2A which includes a contact end (not shown) but which is equivalent to 67 in FIG. 2A in electrical contact with a flange (not shown) but which is equivalent to 17 in FIG. 2. Thus, the body-penetrating contact portion 963 enters the body 911 through one slit 974 at entry site 970, the slit being generally of the same width and thickness as the strip 961.

The particular continuity tester 950 shown, is the one shown in FIGS. 1, 2 and 2A. However, with suitable modifications, which would be clear to a person skilled in this art, the embodiments of the continuity tester described in any of FIGS. 1 to 8 could be used.

(ix) Description of FIG. 10

As seen in FIG. 10, the flashlight 1000 includes the continuity tester 1050 of the present invention which includes a longitudinally-extending outer strip 1051 having one end (not shown) but which is equivalent to 52 in FIG. 2A within the interior of the body 1011 at the rear end of the flashlight 1000 through slit 1055 and then to be in electrical contact behind, and with, a spring (not shown) but which is equivalent to spring 22. The other end of strip 1051 includes a body-penetrating contact portion 1054 which follows the contour and slope of a wall (not shown) but which is equivalent to 71 in FIG. 2A, thence through slit 1073 at entry site 1070 which includes a depressed area 1070A. The strip 1051 finally terminates in a securement end (not shown) but which is equivalent to 54 in FIG. 2A in contact with the inner surface of body 1011. Thus the body-penetrating contact portion 1053 enters the body 1011 through one slit 1073 at entry site 1070, the slit being generally of the same width and thickness as the strip 1051.

The circuit tester 1050 also includes another longitudinally-extending strip 1061, having body-penetrating entry portion (not shown) but which is equivalent to 62 in FIG. 2A, and which enters the interior of the flashlight 1000 through a slit 1065. The strip terminates in a securement end (not shown) but which is equivalent to 64 in FIG. 2A in contact with the inner surface body 1011. Strip 1056 includes a body-penetrating contact portion 1063 which enters through the slit 1074 at entry site 1070 and finally terminates in a forwardly-extending arm (not shown) but which is equivalent to 66 in FIG. 2A which includes a contact end (not shown) but which is equivalent to 67 in FIG. 2A in electrical contact with a flange (not shown) but which is equivalent to 17 in FIG. 2A. Thus, the body-penetrating contact portion 1063 enters the body 1011 through one slit 1074 at entry site 1070, the slit being generally of the same width and thickness as the strip 1061.

The particular continuity tester 1050 shown, is the one shown in FIGS. 1, 2 and 2A. However, with suitable modifications, which would be clear to a person skilled in this art, the embodiments of continuity tester described in any of FIGS. 1 to 8 could be used.

Figure 11:
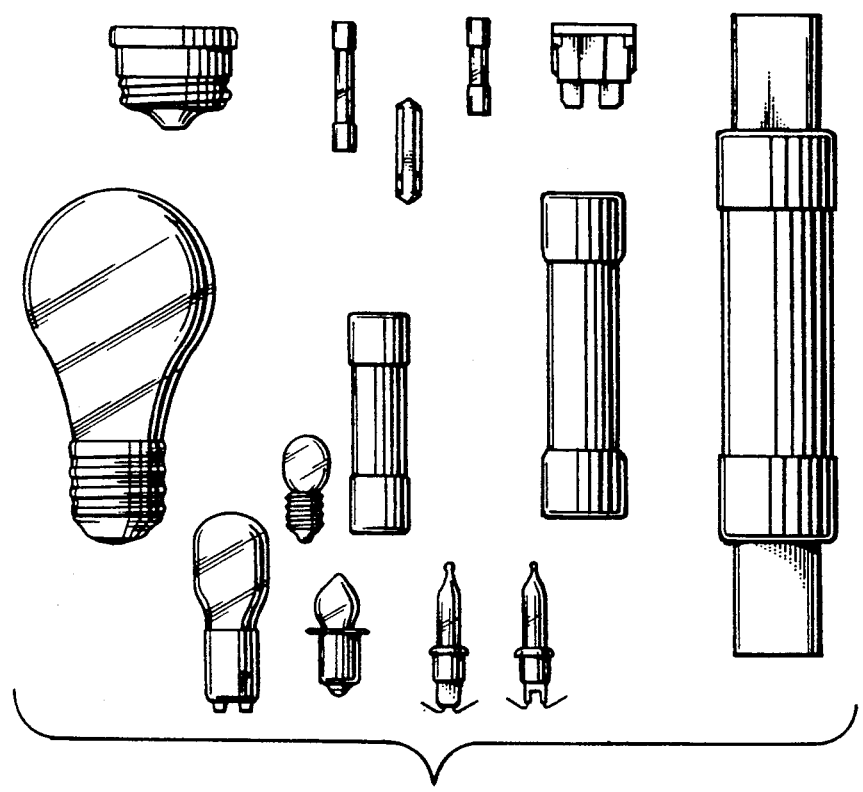
FIG. 11 is a composite view of some of the devices that can be tested using the various embodiments of this invention.

(x) Description of FIG. 11

FIG. 11 shows, cumulatively, some of the fuses and light bulbs whose electrical continuity can be tested using various embodiments of the present invention.

CONCLUSION

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and "intended" to be, within the full range of equivalence of the following claims.

I claim:

1. An improvement in a flashlight having an insulated hollow body providing an interior, and a lamp bulb and batteries in series circuit, said improvement being constituted by an electrical continuity tester, said electrical continuity tester comprising: an entry site, formed in said flashlight body, said entry site including a pair of converging, sloping, facing walls, separated by a floor, said floor being penetrated by a pair of spaced-apart slits, each slit penetrating into said interior of said insulated hollow body; a first electrically-conductive strip having a contact portion, said contact portion following the contour and slope of one wall of said entry site, and passing into the interior of said body through one slit and terminating in a securement end, the other end of said first strip being in electrical contact with one end of said series circuit; a second electrically-conductive strip having a contact portion, said contact portion following the contour and slope of said other wall of said entry site, and passing into the interior of said body through said other slit, and terminating in a conducting end, said conducting end being in electrical contact with an end of the series circuit adjacent said lamp bulb, the other end of said second strip being a securement end; the size of said entry site, the angle of convergence of said walls and the spacing of said spaced-apart slits being selected so as to allow said contact portions of said strips, which follow said contours and slopes of said walls, to act as guideways to guide terminals of a circuit element being tested into suitable electrical contact.

2. The improvement of claim 1 wherein said entry site includes a depressed area.

3. The improvement of claim 1 wherein said electrically-conductive strips are externally-mounted on the flashlight.

4. The improvement of claim 3 wherein the electrically-conductive strips are strips of metal inset flush into the body of the flashlight.

5. The improvement of claim 3 wherein the electrically-conductive strips are strips of metal fixed atop the body of the flashlight.

6. The improvement of claim 3 wherein the electrically-conductive strips are created of electrically-conductive paint painted on an electrically non-conductive body; or are created of electrically-conductive plastic, provided on electrically non-conductive plastic; or are created as a conductive metal strip formed by an electrically-non-conductive coating on a metal body, the non-coated portion providing the metal strip.

7. The improvement of claim 1 wherein said electrically-conductive strips are internally-mounted within the flashlight.

8. The improved testing means of claim 4 wherein said strips extend along a bottom longitudinal axis of said flashlight; wherein said strips are of unequal length; wherein one such strip is electrically connected to the rear end of said series circuit; and wherein the other such strip is connected to the bulb end of said series circuit.

9. The improved testing means of claim 4 wherein said strips extend along a bottom longitudinal axis of said flashlight; wherein said strips are of equal length; wherein one such strip is electrically connected to the rear end of said series circuit; and wherein the other such strip is connected to the bulb end of said series circuit.

10. The improved testing means of claim 5 wherein said strips extend along a bottom longitudinal axis of said flashlight; wherein said strips are of unequal length; wherein one such strip is electrically connected to the rear end of said series circuit; and wherein the other such strip is connected to the bulb end of said series circuit.

11. The improved testing means of claim 5 wherein said strips extend along a bottom longitudinal axis of said flashlight; wherein said strips are of equal length; wherein one such strip is electrically connected to the rear end of said series circuit; and wherein the other such strip is connected to the bulb end of said series circuit.

12. The improved testing means of claim 6 wherein said strips extend along a bottom longitudinal axis of said flashlight; wherein said strips are of unequal length; wherein one such strip is electrically connected to the rear end of said series circuit; and wherein the other such strip is connected to the bulb end of said series circuit.

13. The improved testing means of claim 6 wherein said strips extend along a bottom longitudinal axis of said flashlight; wherein said strips are of equal length; wherein one such strip is electrically connected to the rear end of said series circuit; and wherein the other such strip is connected to the bulb end of said series circuit 14. The improved testing means of claim 6 wherein said strips extend along a bottom longitudinal axis of said flashlight; wherein said strips are of unequal length; wherein one such strip is electrically connected to the rear end of said series circuit; and wherein the other such strip is connected to the bulb end of said series circuit.

15. The improved testing means of claim 7 wherein said strips extend along a bottom longitudinal axis of said flashlight; wherein said strips are of equal length; wherein one such strip is electrically connected to the rear end of said series circuit; and wherein the other such strip is connected to the bulb end of said series circuit.

16. The improved testing means of claim 4 wherein said strip comprises a pair of transverse, disconnected strips across the bottom, cylindrical end of said flashlight; wherein one end thereof is electrically connected to one end of said series circuit; and wherein the other end of said strip is electrically connected to another end of said series circuit.

17. The improved testing means of claim 5 wherein said strip comprises a pair of transverse, disconnected strips across the bottom, cylindrical end of said flashlight; wherein one end thereof is electrically connected to one end of said series circuit; and wherein the other end of said strip is electrically connected to another end of said series circuit.

18. The improved testing means of claim 6 wherein said strip comprises a pair of transverse, disconnected strips across the bottom, cylindrical end of said flashlight; wherein one end thereof is electrically connected to one end of said series circuit; and wherein the other end of said strip is electrically connected to another end of said series circuit.

19. The improved testing means of claim 7 wherein said strip comprises a pair of transverse, disconnected strips across the bottom, cylindrical end of said flashlight; wherein one end thereof is electrically connected to one end of said series circuit; and wherein the other end of said strip is electrically connected to another end of said series circuit.

20. The improved testing means of claim 4 wherein two strips partially encircle one end of the flashlight; wherein one end of one said strip is electrically connected to one end of said series circuit; and wherein one end of the other said strip is electrically connected to another end of said series circuit.

21. The improved testing means of claim 5 wherein two strips partially encircle one end of the flashlight; wherein one end of one said strip is electrically connected to one end of said series circuit; and wherein one end of the other said strip is electrically connected to another end of said series circuit.

22. The improved testing means of claim 6 wherein two strips partially encircle one end of the flashlight; wherein one end of one said strip is electrically connected to one end of said series circuit; and wherein one end of the other said strip is electrically connected to another end of said series circuit.

23. The improved testing means of claim 7 wherein two strips partially encircle one end of the flashlight; wherein one end of one said strip is electrically connected to one end of said series circuit; and wherein one end of the other said strip is electrically connected to another end of said series circuit.

24. The improved testing means of claim 3 including a fusegripping well at the cylindrical end of the flashlight, said well including cylindrical walls, the interior faces of which are provided with a plurality of spaced-apart, longitudinally-extending ribs.

* * * * *